(12) United States Patent
Armitage et al.

(10) Patent No.: US 8,456,074 B2
(45) Date of Patent: Jun. 4, 2013

(54) FLEXIBLE NANOSTRUCTURE ELECTRONIC DEVICES

(75) Inventors: N. Peter Armitage, Los Angeles, CA (US); Keith Bradley, New York, NY (US); Jean-Christophe P. Gabriel, Le Charpen (FR); George Gruner, Los Angeles, CA (US)

(73) Assignees: Nanomix, Inc., Emeryville, CA (US); The Regents of the University of California, Oakland, CA (US)

( * ) Notice: Subject to any disclaimer, the term of this patent is extended or adjusted under 35 U.S.C. 154(b) by 0 days.

(21) Appl. No.: 13/096,891

(22) Filed: Apr. 28, 2011

(65) Prior Publication Data

US 2012/0025165 A1 Feb. 2, 2012

Related U.S. Application Data

(63) Continuation of application No. 10/846,072, filed on May 14, 2004, now Pat. No. 7,956,525.

(60) Provisional application No. 60/471,243, filed on May 16, 2003.

(51) Int. Cl.
*H01J 1/02* (2006.01)
(52) U.S. Cl.
USPC .......................................... 313/309; 313/310
(58) Field of Classification Search
USPC ................................... 313/309–311
See application file for complete search history.

(56) References Cited

U.S. PATENT DOCUMENTS

| | | | |
|---|---|---|---|
| 4,022,059 A | 5/1977 | Schontzler et al. | |
| 4,909,919 A | 3/1990 | Morris et al. | |
| 5,238,729 A | 8/1993 | Debe | |
| 5,448,905 A | 9/1995 | Stetter et al. | |
| 6,261,469 B1 | 7/2001 | Zakhidov et al. | |
| 6,528,020 B1 | 3/2003 | Dai et al. | |
| 6,838,297 B2 | 1/2005 | Iwasaki | |
| 6,878,871 B2 | 4/2005 | Scher | |
| 6,918,284 B2 | 7/2005 | Snow et al. | |
| 6,919,119 B2 | 7/2005 | Kalkan et al. | |
| 6,950,220 B2 | 9/2005 | Abramson | |

(Continued)

OTHER PUBLICATIONS

US Office Action Restriction Requirement and Examiner Interview Summary dated Dec. 3, 2009 issued in U.S. Appl. No. 11/636,360.
US Office Action dated Mar. 24, 2010 issued in U.S. Appl. No. 11/636,360.
US Office Action Final dated Nov. 4, 2010 issued in U.S. Appl. No. 11/636,360.
US Office Action dated Jun. 6, 2011 issued in U.S. Appl. No. 11/636,360.

(Continued)

*Primary Examiner* — Joseph L Williams
*Assistant Examiner* — Kevin Quarterman
(74) *Attorney, Agent, or Firm* — Weaver Austin Villeneuve & Sampson LLP

(57) ABSTRACT

A flexible electronic device is made up of nanostructures. Specifically, the device includes a flexible substrate, a film of nanostructures in contact with the flexible substrate, a first conducting element in contact with the film of nanostructures, and a second conducting element in contact with the film of nanostructures. The nanostructures may comprise nanotubes, such as carbon nanotubes disposed along the flexible substrate, such as an organic or polymer substrate. The first and second conductive elements may serve as electrical terminals, or as a source and drain. In addition, the electronic device may include a gate electrode that is in proximity to the nanotubes and not in electrical contact with the nanotubes. In this configuration, the device can operate as a transistor or a FET. The device may also be operated in a resistive mode as a chemical sensor (e.g., for sensing $NH_3$).

18 Claims, 6 Drawing Sheets

U.S. PATENT DOCUMENTS

| | | |
|---|---|---|
| 6,967,640 B2 | 11/2005 | Albert |
| 6,984,842 B1 | 1/2006 | Nayfeh |
| 7,051,945 B2 | 5/2006 | Empedocles et al. |
| 7,067,867 B2 | 6/2006 | Duan et al. |
| 7,129,554 B2 | 10/2006 | Lieber et al. |
| 7,956,525 B2 | 6/2011 | Armitage et al. |
| 2002/0127623 A1 | 9/2002 | Minshull et al. |
| 2004/0041154 A1 | 3/2004 | Watanabe et al. |
| 2004/0067530 A1 | 4/2004 | Gruner |
| 2004/0204915 A1 | 10/2004 | Steinthal et al. |
| 2005/0079659 A1* | 4/2005 | Duan et al. .................... 438/197 |
| 2005/0184641 A1 | 8/2005 | Armitage et al. |
| 2005/0211572 A1 | 9/2005 | Buck et al. |
| 2006/0102494 A1 | 5/2006 | Chueh et al. |
| 2006/0232278 A1 | 10/2006 | Diamond et al. |
| 2008/0093226 A1 | 4/2008 | Briman et al. |

OTHER PUBLICATIONS

US Office Action Restriction Requirement dated Sep. 19, 2006 issued in U.S. Appl. No. 10/846,072.

US Office Action dated Jan. 5, 2007 issued in U.S. Appl. No. 10/846,072.

US Office Action dated Sep. 12, 2007 issued in U.S. Appl. No. 10/846,072.

US Office Action dated Sep. 15, 2009 issued in U.S. Appl. No. 10/846,072.

US Office Action dated Jun. 24, 2010 issued in U.S. Appl. No. 10/846,072.

US Notice of Allowance dated Feb. 2, 2011 issued in U.S. Appl. No. 10/846,072.

* cited by examiner

FLEXIBLE NANOSTRUCTURE ELECTRONIC DEVICES

CROSS REFERENCE TO RELATED APPLICATIONS

This application claims priority pursuant to 35 USC. §120 to application Ser. No. 10/846,072, filed May 14, 2004, titled "FLEXIBLE NANOSTRUCTURE ELECTRONIC DEVICES," which in turn claims the benefit under 35 U.S.C. §119(e) to U.S. Provisional Application No. 60/471,243, filed May 16, 2003, titled "FLEXIBLE NANOTUBE TRANSISTORS," all of which are specifically incorporated herein, in their entireties, by this reference.

BACKGROUND OF THE INVENTION

1. Field of the Invention

The present invention relates to flexible nanostructure electronic devices, such as nanotube sensors and transistors, and method for fabricating the same.

2. Description of Related Art

Flexible electronics or transistors are desirable for many applications. These applications include applications in flexible displays, wearable electronics, intelligent papers, and lightweight/cheap electronics. To meet these applications, it is important to have a flexible semiconducting channel. Many flexible transistors have been developed by using organic channels such as semiconducting polymers or organic crystals (e.g. crystalline pentane). The other elements of the transistor structures, such as contacts and the gate dielectric, have been made from organic materials and from inorganic materials. The core problem with these previous developments has been that the organic materials have extremely low carrier mobilities. As a result, the transconductance of these devices has been very small. Since transconductance determines the speed of a device, flexible electronics have been very slow. By contrast, nanotube carrier mobilities are extremely high. Therefore, flexible nanotube electronic devices or transistors promise to be superior to other flexible electronic devices or transistors.

Carbon nanotubes have emerged as materials of fundamental importance and great potential due to their exceptional electrical, mechanical, and thermal properties. Various proposals exist for their incorporation into devices based on thin nanotube film architectures and geometries. Very thin nanotube films could be used in fault tolerant sensor networks, thermal heat shunts, as well as for measurements of fundamental nanotube properties in cavity and optical experiments. For such applications the preparation of uniform flat nanotube films is of paramount importance.

However, certain obstacles are encountered in the manipulation of these nano-electronic or microscopic objects. The laying down of a thin film of nanotubes is not easily accomplished. One difficulty arises from the fact that nanotubes have a very poor solubility in typical solvents without the use of surfactants, impeding film-forming using carrier solvents. Furthermore, when nanotubes are suspended or dissolved in solution at low concentrations, evaporation (e.g., drying) of the carrier liquid may result in flocculation and clumping, when the local concentration of nanotubes approaches the solubility limit. Moreover, surfactants that make the nanotubes compatible with aqueous dispersions may be inappropriate for applications that require pure nanotubes. Under some situations, nanotubes can be deposited with spin coating, but for the thinnest films (<1 μm), it is difficult to get adequate uniformity. Strong intertube attractive forces, violent hydrophobicity, and low solubility at moderate concentrations all fight against typical wet chemistry techniques to make uniform films.

It is desirable, therefore, to provide flexible nanotube electronic devices or transistors and methods for making the same that overcomes the above-described shortcomings while retaining their advantages (e.g., by providing superior flexible transistors or a better way of making them).

SUMMARY OF THE INVENTION

The present invention provides a novel flexible electronic device that includes a plurality of nanostructures or nanotubes, and method for making the same, that overcomes the limitations of the prior art. The nanostructure or nanotube device can exhibit properties of a field-effect transistor (FET). The device may be used as a diode, logic element, circuit, resistor, and/or chemical sensor. The device may also be modified to be an n-type transistor, p-type transistor, ambipolar transistor, light-emitting diode, and/or physical sensor (e.g., for sensing light or pressure).

An embodiment of the invention provides an electronic device having a nanostructure film and a flexible substrate. The nanostructure film is supported by the substrate. First and second conducting elements are electrically connected to the nanostructure film, and may also be supported by the flexible substrate. The nanostructure film may comprise nanotubes, such as carbon nanotubes disposed along the flexible substrate, such as a organic or polymer substrate. The nanotubes span the first and second conductive elements, which may serve as electrical terminals, or as a source and drain. In addition, the flexible substrate may act as or comprise a functionalization layer, such as poly(ethylene imine) ("PEI").

The electronic device may also be configured with a gate electrode that is in proximity to the nanotubes but not in electrical contact with the nanotubes. In this configuration, the device can operate as a transistor or a FET. The device may also be operated in a resistive mode as a chemical sensor (e.g., for sensing $NH_3$). It is further believed that similar nanostructures, for example, using nanorods or nanowires instead of nanotubes could be constructed, and would exhibit similar qualities.

A method for forming a nanostructure electronic device according to the invention includes the following steps. A film of nanostructures are formed on a first substrate. The nanostructure film is then transferred to a second substrate that is flexible. Two conducting elements are then made to be in electrical contact to the nanostructure film. In addition, a gate electrode may be formed in proximity to the nanostructure film on the second substrate and not in electrical contact with the nanostructure film.

A more complete understanding of the flexible nanostructure electronic device, and method for making it, will be afforded to those skilled in the art, as well as a realization of additional advantages and objects thereof, by a consideration of the following detailed description of the preferred embodiment. Reference will be made to the appended sheets of drawings which will first be described briefly.

DETAILED DESCRIPTION OF THE PREFERRED EMBODIMENT

Figure 1:
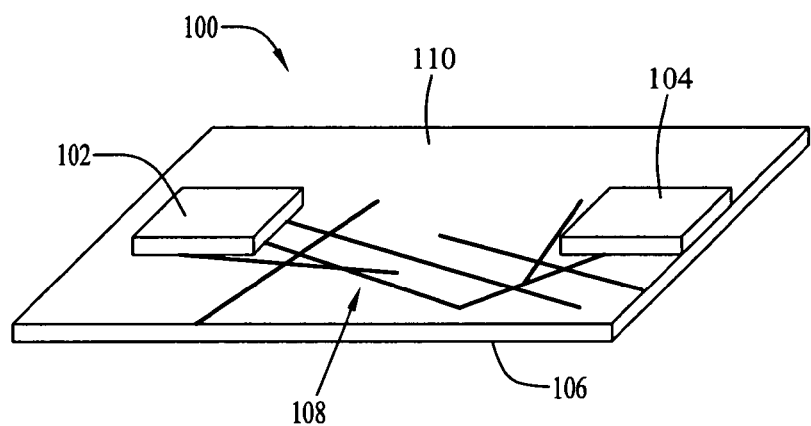
FIG. 1 is a schematic diagram of an exemplary flexible nanostructure device according to the invention.

The present invention provides flexible electronic devices that include a plurality of nanotubes. The devices can exhibit properties of a field-effect transistor (FET). The devices may be used as diodes, logic elements, circuits, resistors, and/or chemical sensors. The devices may also be modified to be n-type transistors, p-type transistors, ambipolar transistors, light-emitting diodes, and/or physical sensors (e.g., for sensing light or pressure).

Embodiments of the invention provide nanotube film electronic components on flexible substrates, or on any other substrate on which it is desired to lay one or more nanostructures using the methods disclosed herein, for example, on organic substrates. Embodiments of the invention include a flexible electronic device comprising at least one nanotube (or other suitable nanostructure) on a flexible substrate and an electronic device comprising a dispersion of nanotubes (or nanostructures) on a flexible substrate. The devices can include many nanotubes, oriented randomly (or aligned parallel or perpendicular to the surface), as individual nanotubes, or as nanotube ropes. The devices may also include electrodes contacting the nanotube(s) electrically. Advantageously, devices can be constructed on flexible substrates, and consequently may be flexed, bent, turned, bowed, or twisted without breaking, unlike stiff or brittle substrates as used in the prior art.

In addition to providing for and/or including nanotube films, films made of other nanostructures can be used and/or provided. These include nanospheres, nanocages, nanococoons, nanofibers, nanowires, nanoropes and nanorods. A nanotube is a single-walled tubular nanostructure that can be made of carbon, germanium, or any other suitable material. It should be appreciated that the term "nanotube" as used herein is not generally intended to exclude the use of alternative nanostructures, insofar as the embodiments described herein may be modified to make use of alternative nanostructures instead of, or in addition to, nanotubes. Nanostructures, like nanotubes, can be made of many different elements and compounds. Examples of such materials include carbon, boron, boron nitride, and carbon boron nitride, silicon, germanium, gallium nitride, zinc oxide, indium phosphide, molybdenum disulphide, and silver.

The invention may be used to construct a wide variety of electronic devices. Examples of electronic devices that may be encompassed by the disclosed embodiments include a transistor (incorporating a third electrode, the gate electrode); a diode; a logic element; a circuit; a resistor; a chemical or biological sensor; modified to be an n-type, p-type, or ambipolar transistor; a light-emitting diode; or a physical sensor (e.g. light or pressure).

There are two main types of nanostructure films: networks and mats. Networks are substantially monolayer structures comprised principally of individual nanotubes, and are usually best for devices where semiconducting properties are desired, such as transistors. Mats are multilayer structures comprised principally of nanotube ropes, have a higher density of nanotubes per unit substrate area than networks, and are usually best for resistors (or conductors). Nanotube films encompass both networks and mats, and thus may be classed as networks, mats, as intermediate between networks and mats, or as composites of networks and mats.

An electronic device can be configured such that, when the density of nanotubes on the substrate is relatively high, the film of nanotubes acts as a resistor (i.e., a conductive material having essentially metallic conduction properties). When the density of nanotubes is intermediate, the film acts as a semiconductor. When the density is low, it does not conduct. When the density of the nanotube film is on the edge of conduction, the device can be a very sensitive sensor.

FIG. 1 shows an exemplary flexible electronic device 100 that includes at least two electrodes 102, 104. If configured as a field-effect transistor, electrodes 102, 104 may function, for example, as source and drain electrode, respectively. Electrodes 102, 104 are electrically connected with the nanotube(s) 108. Nanotube(s) 108 are supported by a flexible substrate 110 having dielectric properties. A third electrode 106 may be positioned underneath substrate 110, so as to be insulated from electrical contact with the nanotube(s) 108. In a field-effect transistor device, the third electrode 106 may function as a gate electrode. In FIG. 1, the third electrode 106 is shown to be disposed on or adjacent to a surface of the flexible substrate 110, opposite the surface supporting the nanotube(s) 108. Electrodes 102, 104, 106 can be made from any suitable conductive material, for example: metallic film(s); conductive polymer(s), in which the conductive polymer(s) are a different polymer from the substrate; conductive polymer, in which the conductive polymer is the same polymer as the substrate, but is differently doped; conductive nanotube film; and combinations of the forgoing exemplary materials.

The flexible substrate 110 may comprise an organic polymer, but it could be some other flexible material, organic or inorganic. For example, the flexible substrate 110 may comprise organic molecules, polymers, porous polymers, metal oxides, and/or porous metal oxides. Flexible substrates may be flexed substantially without breaking, as distinct from typical semiconductor substrates such as silicon or other semiconductor materials. Flexibility may be determined by the characteristics of the substrate material, as well as by the geometry of the substrate. The invention permits devices to be constructed on very flexible substrates having the geometric form of a thin film. For example, in some embodiments, flexible substrates for use with the invention may have a modulus of less than about 1 Mbar (i.e. 100 GPa).

In an embodiment of the invention, a polymeric electrolyte, which is an ionic conductor, is used as the substrate 110. As such, it can also be the gate 106 for the nanotube transistor 100 (e.g., the gate comprises the substrate that supports the nanostructure network). The flexible substrate 110 can also be porous, such as a porous polymer, and the nanotube film 108 can support itself over the pores. In addition, the flexible substrate can be transparent (e.g., be transparent to electromagnetic radiation in at least one range of wavelengths or be transparent to light).

The substrate 110 may also comprise a functionalization layer, sometimes referred to as a recognition layer in the context of a sensor device. Various polymer materials may be selected for use as a functionalization layer, some examples of which are provided later in the specification. The functionalization layer may be applied to the nanotube(s) 108 using any suitable method. For example, in an embodiment of the invention, the substrate 110, electrodes 102, 104 and nanotube(s) 108 were submerged in a solution of poly(ethylene imine) (PEI, average molecular weight ~25,000, Aldrich) at about 20% by weight in methanol. After soaking overnight, they were removed and rinsed with methanol. A thin layer, such as less than 10 nm of PEI, coated the exposed portion of nanotube(s) 108 after rinsing. Other suitable polymers, or combinations of polymers, may be substituted for PEI. Other solvents and rinse agents may also be suitable.

The functionalization layer may serve to change the electrical characteristics of a nanotube device (i.e., one lacking functionalization layer). For example, prior to PEI coating, an as-made semiconducting nanotube device can exhibit p-type FET characteristics but after addition of the functionalization or PEI layer, the device exhibits properties of a n-type FET.

Other polymers that may be used to effect electrical characteristics or conductivity changes in nanotubes can include: poly(4-vinylphenol); poly(styrene-co-allyl alcohol), 5.7% hydroxyl; poly(a-methylstyrene); poly(vinyl chloride-co-vinyl acetate), 10% vinyl acetate; poly(vinyl acetate); poly(N-vinylpyrrolidone); poly(carbonate bisphenol A); poly(styrene); poly(styrene-co-maleic anhydride), 50% styrene; poly(sulfone); poly(methyl methacrylate); poly(methyl vinyl ether-co-maleic anhydride); poly(vinyl butyral); poly(vinylidene chloride-co-acrylonitrile), 80% vinylidene chloride; poly(caprolactone); poly(entylene-co-vinyl acetate), 82% ethylene; and/or poly(ethylene oxide).

Figure 2:
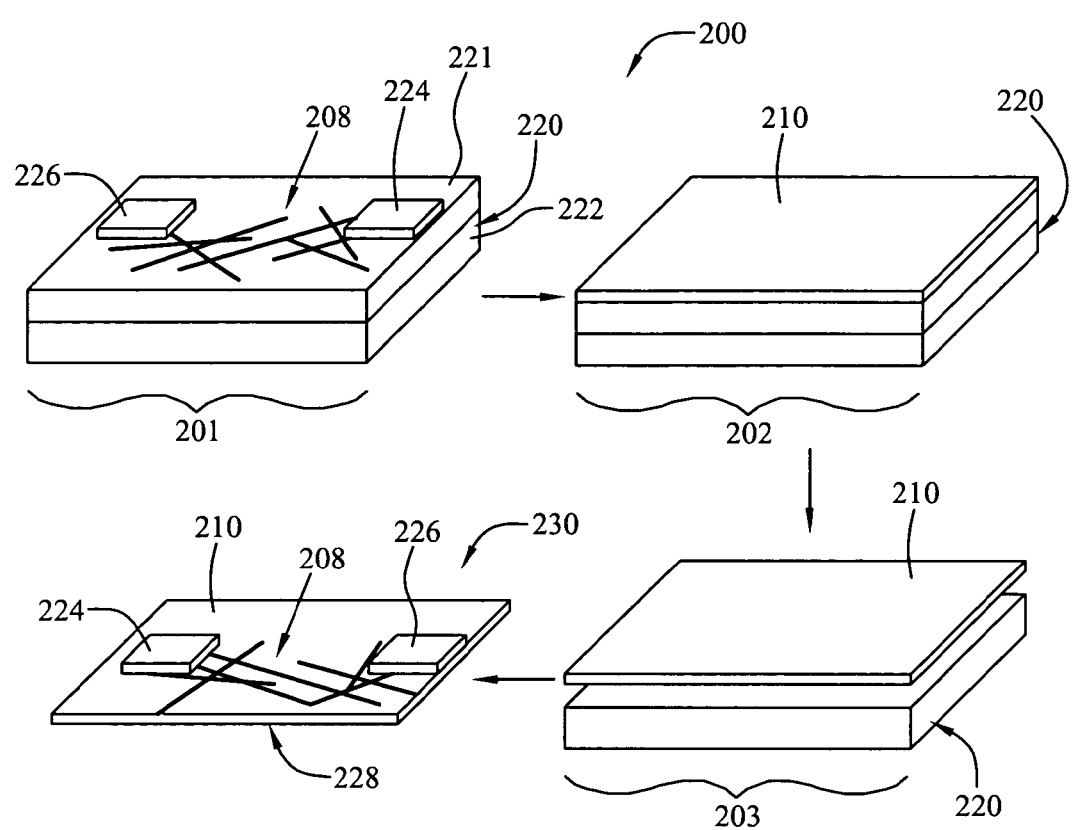
FIG. 2 is a flow diagram showing exemplary steps of a method according to the invention.

Referring now to FIG. 2, one method 200 of forming flexible nanostructure electronic devices includes an initial step 201 of depositing or growing (for example, by chemical vapor deposition) a nanotube film 208 on a rigid substrate 220. Substrate 220 may comprise, for example a silicon material 222 covered by a layer of silicon oxide 221. Optionally, contacts 224, 226 may be formed on the substrate, either before or after the nanotube film is formed. At step 202, nanotube film 208 and substrate 220 may be coated with a flexible substrate layer 210. Flexible substrate layer 210 may comprise any suitable material capable of forming a coating film, for example, a liquid polymer. Suitable materials for layer 210 may include, for example, polyacrylamide, polyacrylonitrile, polyaniline, polypyrrole, polythiophene, polystyrene, polybutadiene, poly(dimethylsiloxane), polyethylene, polycarbonate, poly(ethylene glycol), poly(ethylene oxide), poly(ethylenimine), poly(alkyl methacrylate), poly(propylene), polyoxyethylene, polytetrafluoroethylene, poly(vinyl alcohol), and/or polyvinylpyrrolidone. The polymer should be selected to provide the electrical and mechanical properties that are desired for the substrate of the device to be formed. The polymer 210 may be deposited as a liquid layer, and then cured, hardened, or otherwise solidified to provide the desired substrate material.

At step 203, rigid substrate 220 is removed from substrate 210, for example, by dissolving the substrate in a suitable etching agent. Optionally, one or more electrodes (not shown) may be formed on the exposed surface of substrate layer 210, either before or after it is removed from the rigid substrate. For example, a gate electrode (not shown at 203) may be placed opposite to the nanotube film 208. Turning substrate 210 over should yield a device 230 as shown at the lower left of FIG. 2 (shown rotated 180° relative to its position at 201). The device 230 may comprise source and drain electrodes 224, 226, nanotube network 208 connecting the source and drain, and a gate electrode 228 on the opposite side of dielectric flexible substrate layer 210.

In the alternative, or in addition, nanotubes can be placed on both sides of a flexible substrate such as substrate 210. This may be accomplished, for example, by forming a nanotube film on two separate rigid substrates, and coating the substrates with their respective nanotube films with a polymer as described above. Then, the two rigid substrates may be placed together while the polymer is still at least partially uncured, and held in place until the polymer layers fuse or blend together. Curing or other solidification of the polymer may be completed while substrates are held together. Then, the rigid substrates may be removed as previously described, leaving a single flexible substrate with nanotubes supported on opposing surfaces of a substrate layer or film.

Nanotube network transistors, including nanotube films and at least two electrodes, can be fabricated on rigid substrates using conventional methods, before being transferred to a flexible substrate as described herein. The density of the nanotube networks can be controlled by chemical vapor deposition process conditions, as known in the art. It may be useful to form densities from just below a percolation threshold (i.e., the density below which there is no conducting path between the electrodes comprised solely of nanostructures) to just above the percolation threshold (i.e., having just one conducting path between the electrodes comprised solely of nanostructures).

Electrodes for connecting to the network, or gate electrodes, can include one, two, or more layers. Electrodes may be formed by depositing a layer of titanium onto the rigid substrate, and then depositing a layer of gold over the titanium. These metal layers are later patterned and etched as known in the art to form the desired electrode geometry.

Some portion of the nanotubes making up a network often may exhibit metallic conduction properties. In such devices, the nanotube density may be controlled so as to be below the percolation threshold for the metallic nanotubes in the network. In this intermediate range, the overall nanotube density should be above the percolation threshold while the metallic nanotubes are below the percolation threshold, and therefore every conducting path contains at least one semiconducting nanotube. Semiconducting nanotubes can be turned on and off using a gate field. Consequently, in the intermediate range, the network can be turned on and off using a gate field, providing transistor action.

Such network transistors may be removed from the rigid substrate and deposited on (or in) a polymer substrate, for example, by using method 200. Care should be taken to preserve the desired nanotube film density during this process. The nanotube films are tenuous and weak, so that it is difficult to peel them off the rigid substrate. One approach may include, for example, coating the rigid substrate with a dissolved polymer on the surface that contains the nanostructure film and the electrodes. The substrate may then be heated to cure the polymer. While in its liquid state, polymer may seep around the nanostructures ad solidified in place, thus encasing the nanotubes in a supporting matrix. The rigid substrate may be placed in a chemical or etching solution to remove the rigid substrate. The chemical solution may also remove a titanium layer, if present, leaving a gold layer attached to the polymer. The polymer with nanotubes and gold electrodes attached may be removed from the etching solution, thus resulting in a flexible nanotube network transistor. Instead of dissolving the rigid substrate, it may sometimes be possible to peel the polymer with the nanostructures and the electrodes attached off the rigid substrate.

Figure 3:
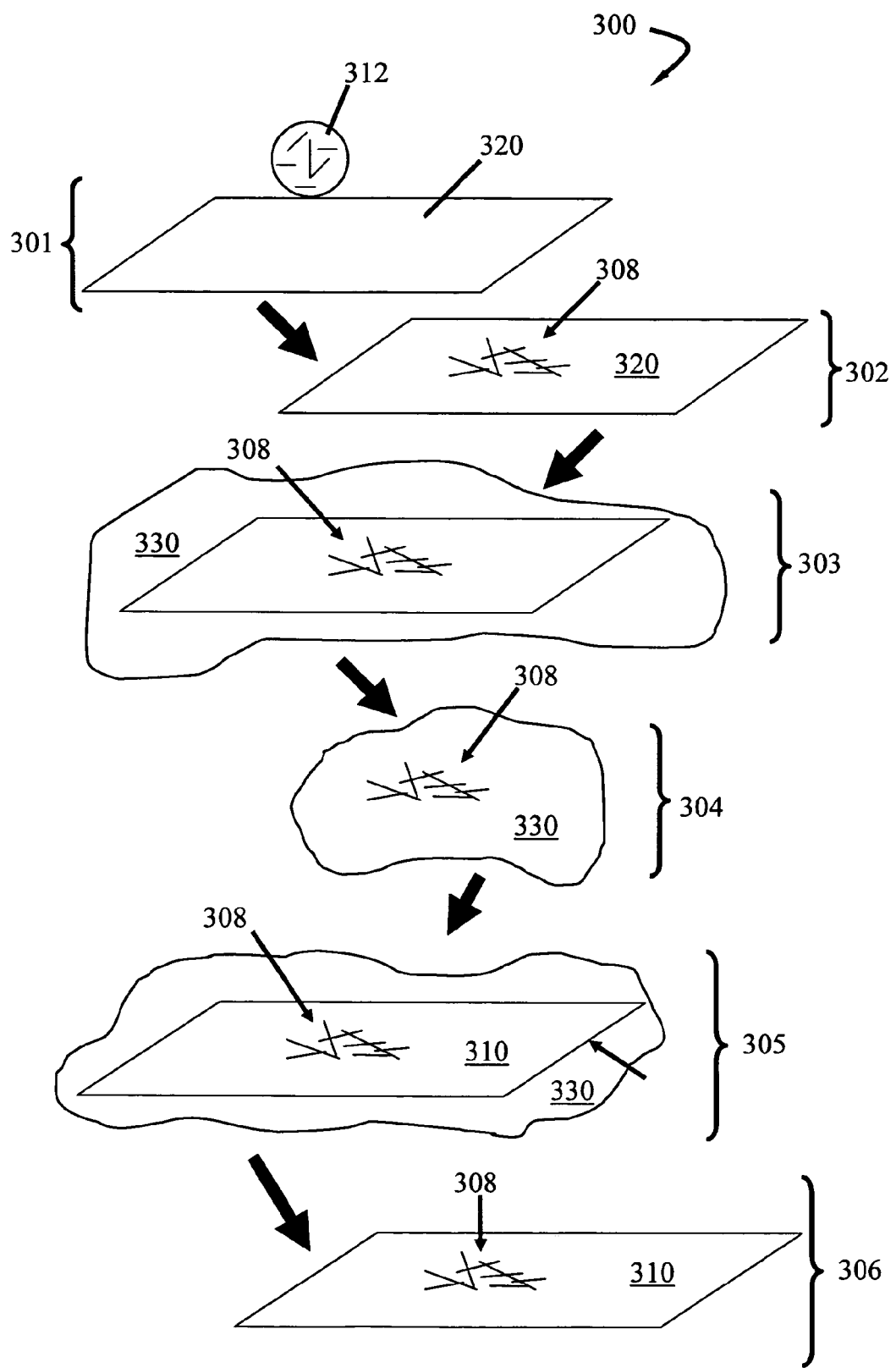
FIG. 3 is a flow diagram showing exemplary steps of an alternative method according to the invention.

Flexible nanostructure electronic devices may also be formed by depositing nanotubes on a substrate using a quasi-Langmuir-Blodgett technique 300, as diagrammed in FIG. 3. In general, the method 300 may be used to prepare a uniform nanotube film 308 by deposition from solution onto a porous filter, substrate or membrane 320 (e.g., a alumina, cellulose, cellulose ester, silica, borosilicate, polytetrafluoroethylene, polyethersulfone, polysulfone, and/or nylon membrane). At step 301, the nanotubes are suspended or dissolved in a carrier liquid or solvent, which is chosen to have a density less than the density of water. For example, a suitable liquid or solvent may comprise DmbDcb (1,2-dimethylbenzene(ortho-xylene) and 1,2-dichlorobenzene), 1,3-dichlorobenzene, chlorobenzene, and/or carbon disulfide. The ratio of 1,2-dimethylbenzene(ortho-xylene) to 1,2-dichlorobenzene may be, for example, between about 1:1 and 100:1. In the alternative, the ratio may be between about 5:1 and 15:1. Droplets 312 (one of many shown) of the solvent/nanotube suspension may be dropped onto the filter 320. At step 302, the carrier liquid quickly passes through filter 320, forming a raft 308 of nanotubes. Each droplet 312 may contain enough nanotubes for a single raft, or multiple droplets may be used to form a single raft. The concentration of nanotubes in droplets 312 may be, for example, between about 1 mg/L and 15 mg/L or 1 mg/L and 5 mg/L. The membrane 320 may comprise a porous alumina membrane with a pore size between about 0.05 μm and 5.00 μm or about 0.2 μm.

In an embodiment of the invention, the membrane itself may be used as a supporting substrate, with or without providing an additional layer of flexible material as a functionalization and/or structural material. For such embodiments, the desired electrodes may be formed on membrane 320 either before or after step 302. Desired functionalization or supporting layers may then be deposited over or adjacent to the raft of nanotubes 308. In this embodiment, the diagrammed steps 303-306 do not apply.

Referring again to FIG. 3, at step 303 the filter 320 may be immersed in a solvent (not shown) which suspends nanotubes effectively, causing raft 308 to be loosened from filter 320. Next, the filter the loosened raft may be carefully immersed in water or other suitable liquid having a specific gravity greater than the nanotube raft. For example, de-ionized water may be used as a principal constituent. The nanotube film 308 should float to the top surface of the suspending liquid 330, which may comprise water, a combination of water and solvent, or other suitable liquid. At step 304, the filter 320, free of the raft 308, may be removed from the suspending liquid, leaving the raft floating in the liquid 330. At step 305, the removed filter may be replaced with a substrate 310 of choice, such as a flexible substrate or an organic substrate. Subsequently, the liquid 330 is removed, and the substrate 310 is dried, leaving the nanotube film 308 on the flexible substrate 310. Electrodes (not shown) can be added to complete the device. In the alternative, the electrodes may be disposed on the substrate 310 before the nanotube film 308 is transferred to the substrate 310. Additional layers of flexible material (not shown) such as functionalization or supporting layers, may be subsequently deposited over or adjacent to the nanotubes 308.

In the alternative to method 300, a flexible film having an adhesive outer surface can be pressed or placed against the rafts of nanotubes on the filter, and then peeled off, taking the nanotube film with it. Electrodes can be added to complete the device. It may be more difficult to avoid damaging delicate nanotube networks using this alternative method.

The following examples provide further details concerning films of uniform nanostructures or nanotubes, and methods for making them, in accordance with the invention.

Example A

A nanotube network was grown by chemical vapor deposition on a silicon substrate with a 200 nm silicon oxide coating, as described in U.S. patent application Ser. No. 10/177,929, filed Jun. 21, 2002 by Gabriel et al., which is hereby incorporated by reference, in its entirety. Then the silicon substrate with the network was patterned with optical lithography, and a liftoff process, to form 100 μm square metal contacts. The metal contacts comprised a 3.5 nm thick titanium film covered by a 50 nm thick gold film. After liftoff, the silicon substrate with network and metal contacts was spin-coated with polyimide (HD 2610, 500 rpm). The silicon substrate was heated at 90° C. for 10 minutes, 120° C. for 5 minutes, and 200° C. for 30 minutes to cure the polyimide. Finally, the silicon substrate was immersed in 10% hydrofluoric acid (HF) for 8 hours. The polyimide films, floating freely in the HF solution, were removed and rinsed with deionized water.

Figure 4:
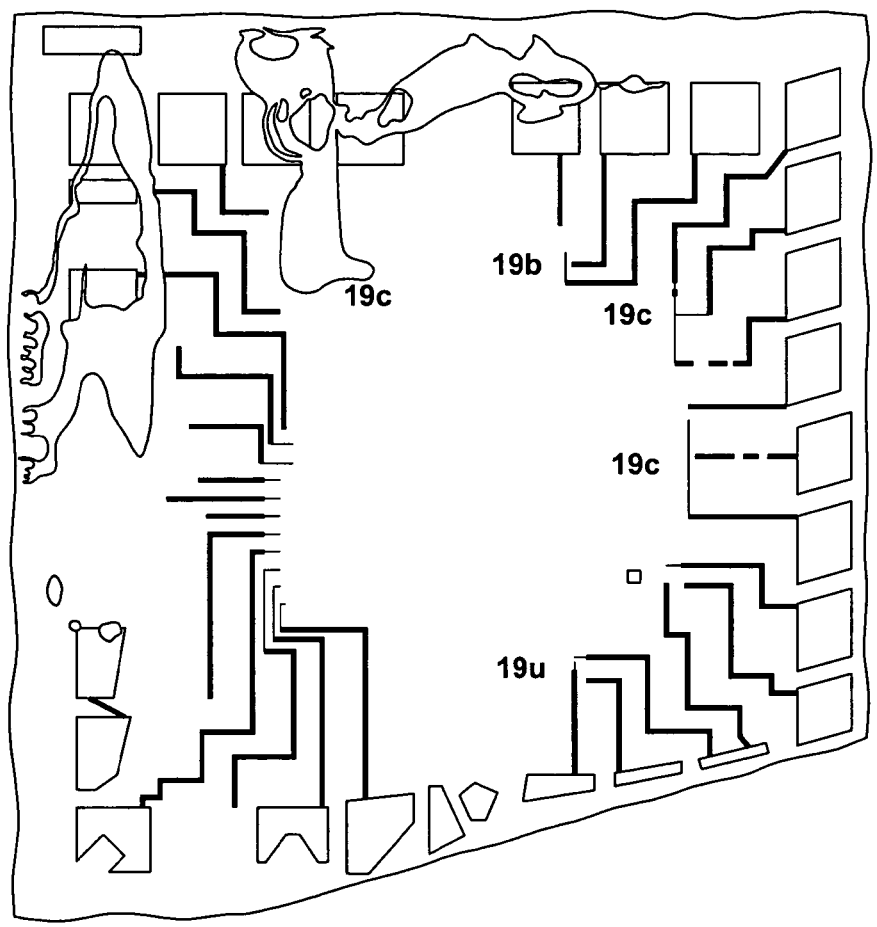
FIG. 4 is an image of a film of nanostructures with metal contacts according the invention.

A device on a flexible substrate 400, resulting from a process such as the foregoing, is shown in FIG. 4. Multiple electrodes such as electrode 401 were patterned on substrate 400. Nanotube networks connected source and drain electrodes, and were opposite a gate electron of the opposite side of film 400. The film 400 was inspected using a microscope, and suitably configured field-effect transistor device were selected for electrical testing.

Figure 5:
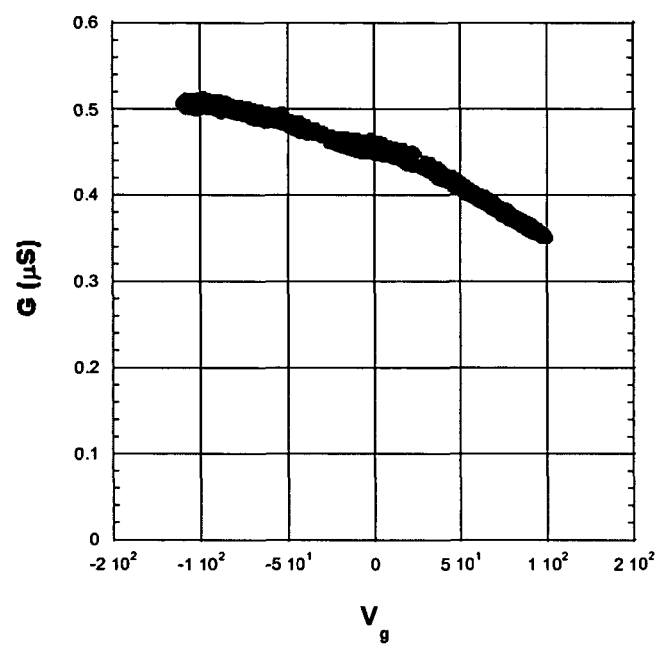
FIG. 5 shows electrical characterizations between two metal contacts of a transistor according to the invention.
Figure 6:
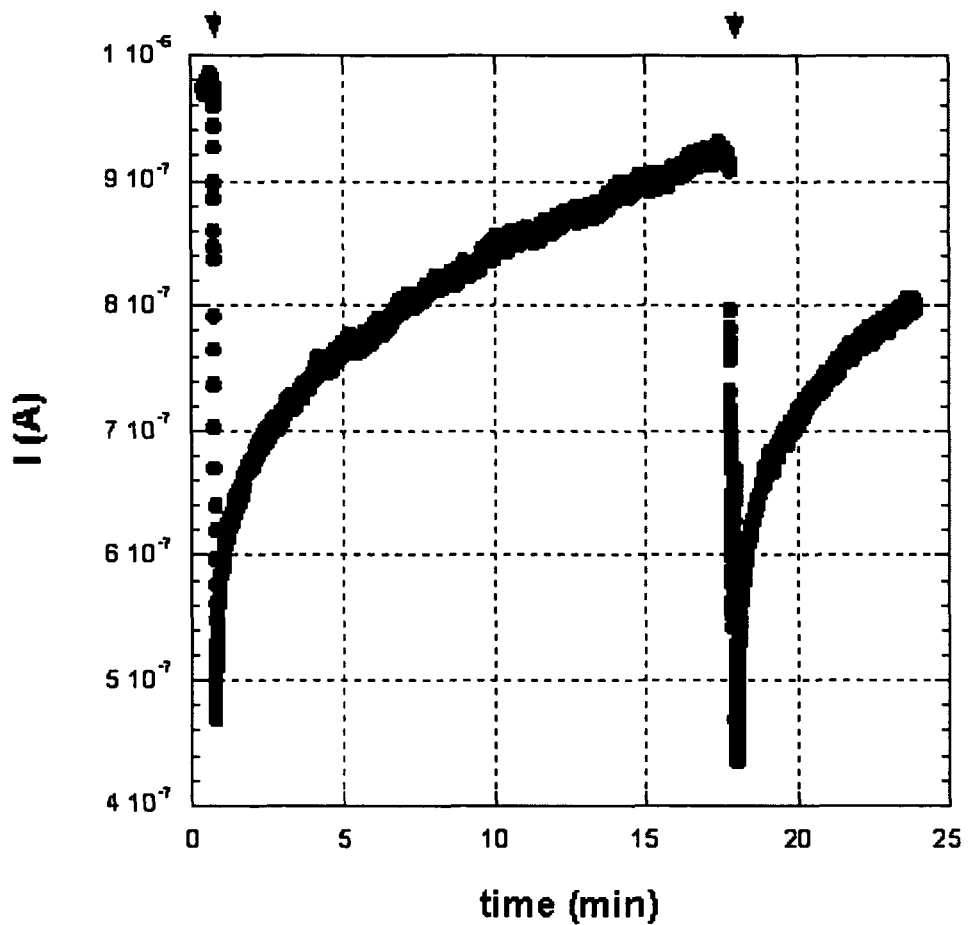
FIG. 6 shows sensing capabilities of a chemical sensor according to the invention.

FIGS. 5 and 6 show exemplary electrical properties achieved for a field-effect transistor device on a flexible substrate. FIG. 5 shows a decrease in conductivity with increasing voltage. Between −100V and +100V, a modulation of approximately 25% was observed for one device. Higher gate voltages (i.e., higher than 100V) may be able to modulate completely (i.e., to turn completely off a FET constructed by the present exemplary embodiment). FIG. 7 shows the $NH_3$ sensing capabilities of a chemical sensor constructed using a flexible field-effect transistor. Introduction of $NH_3$ to a test chamber caused a rapid and easily measured change in conductivity of the device.

Example B

A nanotube solution was made using nanotubes grown by laser ablation. To make the solution, nanotubes were dispersed in 10:1 dimethylbenzene:dichlorobenzene solution using a high-powered ultrasonicator. The concentration of nanotubes was between 1 mg/L and 5 mg/L. The solution was placed on an alumina membrane (Whatman, 0.2 μm pore size), and a pump was used to draw the solvent through the membrane. A uniform nanotube film was found deposited on the membrane. While the membrane was still damp with solvent, a chamber underneath the membrane was filled with deionized water. When the water reached the membrane, the nanotube film was observed to float free of the membrane. The film floated on the water surface in the form of large rafts. At this point, the device substrate was slipped into the water under the rafts, then the pump was used to remove the water. As the water disappeared, the rafts were redeposited on the substrate.

The invention has been described herein in considerable detail to provide those skilled in the art with information relevant to apply the novel principles and to construct and use such specialized components as are required. However, it is to be understood that the invention can be carried out by different equipment, materials and devices, and that various modifications, both as to the equipment and operating procedures, can be accomplished without departing from the scope of the invention itself. For example, a nanotube device has been illustrated, but it should be apparent that the inventive concepts described above would be equally applicable to devices that incorporate other nanostructures, such as nanorods, nanofibers or nanowires. The invention is further defined by the following claims.

What is claimed is:

1. An electronic device, comprising: a flexible substrate; a film of nanostructures supported by the flexible substrate; and a first conducting element in contact with the film of nanostructures, wherein the film of nanostructures comprises a three-dimensional, multiple-layer mat of nanostructures.

2. The device of claim 1, further comprising a gate electrode in proximity to the film of nanostructures and not in electrical contact with the film of nanostructures.

3. The device of claim 2, wherein the gate electrode comprises a conductive nanostructure network.

4. The device of claim 1, wherein the electronic device is selected from the group consisting of transistors, chemical sensors, biological sensors, light sensors, pressure sensors, diodes, logic elements, circuits, resistors, and light-emitting diodes.

5. The device of claim 1, wherein the flexible substrate is selected from the group consisting of organic molecules, polymers, porous polymers, metal oxides, porous metal oxides.

6. The device of claim 1, wherein the flexible substrate is transparent to electromagnetic radiation in at least one range of wavelengths.

7. The device of claim 1, wherein the film of nanostructures comprises at least one nanostructure selected from the group consisting of nanotubes, nanospheres, nanocages, nanococoons, nanofibers, nanowires, nanoropes and nanorods.

8. The device of claim 1, wherein the film of nanostructures is uniform.

9. The device of claim 1, further comprising second conducting element in contact with the film of nanostructures.

10. The device of claim 1, wherein the film of nanostructures has essentially metallic conduction properties.

11. The device of claim 1, wherein the film of nanostructures has essentially semiconducting conduction properties.

12. The device of claim 1, wherein the film of nanostructures is on a surface of the substrate.

13. The device of claim 1, wherein the film of nanostructures is within the substrate.

14. The device of claim 1, wherein the first conducting element is an electrode.

15. The device of claim 14, wherein the electrode comprise at least one metal selected from the group consisting of transition metals and aluminum.

16. The device of claim 9, wherein the first conducting element and the second conducting element comprise conductive nanostructure networks.

17. The device of claim 1, wherein the flexible substrate comprises an organic substrate.

18. The device of claim 1, wherein the flexible substrate comprises a polymer substrate and the film of nanostructures comprises a film of carbon nanotubes.

* * * * *